(12) United States Patent
Li et al.

(10) Patent No.: US 11,462,046 B2
(45) Date of Patent: Oct. 4, 2022

(54) DISPLAY PANEL, DISPLAY APPARATUS AND METHOD OF CONTROLLING THE SAME

(71) Applicants: HEFEI BOE OPTOELECTRONICS TECHNOLOGY CO., LTD., Hefei (CN); BOE TECHNOLOGY GROUP CO., LTD., Beijing (CN)

(72) Inventors: Shanshan Li, Beijing (CN); Peilong He, Beijing (CN); Jie Cao, Beijing (CN); Shuai He, Beijing (CN); Ming Fang, Beijing (CN); Chengbing Zhu, Beijing (CN); Sheng Wang, Beijing (CN); Xiaofei Zhu, Beijing (CN); Yeyin Xia, Beijing (CN)

(73) Assignees: HEFEI BOE OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 196 days.

(21) Appl. No.: 16/862,871

(22) Filed: Apr. 30, 2020

(65) Prior Publication Data
US 2021/0165990 A1    Jun. 3, 2021

(30) Foreign Application Priority Data

Nov. 29, 2019    (CN) .......................... 201922121784.4

(51) Int. Cl.
*H01L 27/32*    (2006.01)
*G06V 40/13*    (2022.01)
*G06V 40/12*    (2022.01)
*H01L 27/146*    (2006.01)

(52) U.S. Cl.
CPC ...... *G06V 40/1318* (2022.01); *G06V 40/1365* (2022.01); *H01L 27/3234* (2013.01); *H01L 27/3272* (2013.01); *H01L 27/14678* (2013.01)

(58) Field of Classification Search
CPC ............ G06V 40/1318; G06V 40/1365; H01L 27/3234; H01L 27/3272; H01L 27/14678; G06F 21/32; H04M 1/0266
See application file for complete search history.

(56) References Cited

U.S. PATENT DOCUMENTS

2020/0111851 A1*   4/2020   Park ........................ G06F 21/32
2021/0036047 A1*   2/2021   Heo ..................... H04M 1/0266

* cited by examiner

*Primary Examiner* — Abdul-Samad A Adediran
(74) *Attorney, Agent, or Firm* — McDermott Will & Emery LLP

(57) ABSTRACT

A display panel includes: a base, light-emitting devices, auxiliary light-emitting devices and a texture identification layer disposed above the base. The light-emitting devices are configured to emit light for display. Each auxiliary light-emitting device has a same light-emitting direction as the light-emitting devices and is configured to emit light in response to receiving a control signal during the display panel being in a screen-off state. The texture identification layer is configured to receive reflected light that is reflected to the texture identification layer in light emitted by the auxiliary light-emitting devices to an outside of the display apparatus, so as to perform texture identification.

18 Claims, 9 Drawing Sheets

DISPLAY PANEL, DISPLAY APPARATUS AND METHOD OF CONTROLLING THE SAME

CROSS-REFERENCE TO RELATED APPLICATION

This application claims priority to Chinese Patent Application No. 201922121784.4 filed Nov. 29, 2019, which is incorporated herein by reference in its entirety.

TECHNICAL FIELD

The present disclosure relates to the field of display technologies, and in particular, to a display panel, a display apparatus and a method of controlling the same.

BACKGROUND

With the development of texture (such as fingerprint) detection technology, the fingerprint detection technology is widely used in devices such as mobile phones, tablet computers, televisions, access controls, safes, etc. The fingerprint detection technologies mainly include optical fingerprint identification, capacitive fingerprint identification, and ultrasonic fingerprint identification.

SUMMARY

In one aspect, a display panel is provided. the display apparatus includes: a base; light-emitting devices disposed above the base, the light-emitting devices being configured to emit light for display; auxiliary light-emitting devices disposed above the base, each auxiliary light-emitting device having a same light-emitting direction as the light-emitting devices and being configured to emit light in response to receiving a control signal during the display panel being in a screen-off state; a texture identification layer disposed above the base, the texture identification layer being configured to receive reflected light that is reflected to the texture identification layer in light emitted by the auxiliary light-emitting devices to an outside of the display apparatus, so as to perforem texture identification.

In some embodiments, the display panel further includes control circuits, each control circuit being electrically connected to a respective one of the auxiliary light-emitting devices, and being configured to control the respective one of the auxiliary light-emitting devices to emit light.

In some embodiments, one auxiliary light-emitting device of the auxiliary light-emitting devices includes a first electrode, an auxiliary light-emitting layer, and a second electrode that are sequentially stacked above the base, and the first electrode is electrically connected to a corresponding control circuit.

the display panel further includes pixel circuits, each pixel circuit being electrically connected to a respective one of the light-emitting devices, and being configured to control the respective one of the light-emitting devices to emit ligh. Layers where the control circuits are located and layers where the pixel circuits are located are same layers.

In some embodiments, layers where the auxiliary light-emitting devices are located and layers where the light-emitting devices are located are same layers, each auxiliary light-emitting device is disposed between two adjacent light-emitting devices, and the auxiliary light-emitting device and any of the two adjacent light-emitting devices have a gap therebetween.

In some embodiments, the texture identification layer includes texture identification units. Layers where the texture identification units are located and the layers where the auxiliary light-emitting devices are located are same layers. Or, the texture identification units are disposed at a side of the auxiliary light-emitting devices away from the base, and orthographic projections of the texture identification units on the base are non-overlapping with orthographic projections of the auxiliary light-emitting devices on the base and orthographic projections of the light-emitting devices on the base.

In some embodiments, the texture identification layer includes texture identification units. The texture identification units are disposed between the auxiliary light-emitting devices and the base. Or, the texture identification units are disposed at a side of the base away from the auxiliary light-emitting devices.

In some embodiments, the auxiliary light-emitting devices are light-transmissive devices. An orthographic projection of one of the auxiliary light-emitting devices on the base overlaps an orthographic projection of a corresponding texture identification unit on the base.

In some embodiments, the auxiliary light-emitting devices are opaque devices. The display panel further includes light-transmitting units, layers where the light-transmitting units are located and the layers where the auxiliary light-emitting devices are located are same layers, and each light-transmitting unit is disposed between two adjacent light-emitting devices and/or between an auxiliary light-emitting device and a light-emitting device that are adjacent. An orthographic projection of the light-transmitting unit on the base overlaps an orthographic projection of a corresponding texture identification unit on the base.

In some embodiments, the texture identification units are disposed at the side of the auxiliary light-emitting devices away from the base, and the display panel further includes light-shielding patterns each disposed on a surface of a respective one of the texture identification units facing the base. An orthographic projection of one of the texture identification units on the base is located within a range of an orthographic projection of a corresponding light-shielding pattern on the base.

In some embodiments, the auxiliary light-emitting devices are disposed at a side of the light-emitting devices proximate to the base, and an orthographic projection of one of the auxiliary light-emitting devices overlaps at least to an orthographic projection of a gap between two adjacent light-emitting devices.

In some embodiments, the auxiliary light-emitting devices are disposed at a side of the light-emitting devices away from the base, and an orthographic projection of one of the auxiliary light-emitting devices overlaps at least to an orthographic projection of a gap between two adjacent light-emitting devices.

In some embodiments, the display panel has a display area, and the display area includes a plurality of sub-pixel regions and a non-sub-pixel region. Each light-emitting device is located in a respective one of the plurality of sub-pixel regions, and the auxiliary light-emitting devices are located in the non-sub-pixel region.

In some embodiments, the plurality of sub-pixel regions include a plurality of rows of sub-pixel regions arranged along a first direction, sub-pixel regions in each row are arranged in a second direction, and the first direction is intersected with the second direction. In any two adjacent rows of sub-pixel regions, lines extending in the first direction passes through a sub-pixel region located in an even row and a region between two adjacent sub-pixel regions located in an odd row in the second direction. Two adjacent rows of sub-pixel regions have a preset gap therebetween. A length of each auxiliary light-emitting device in the second direction and a width in the first direction are both equal to a width of the preset gap in the first direction.

In some embodiments, light emitted by the auxiliary light-emitting devices is invisible light.

In another aspect, a display apparatus is provided. The display apparatus includes the above display panel, and a control component electrically connected to the auxiliary light-emitting devices and a touch structure. The control component is configured to control the auxiliary light-emitting devices to emit light in response to receiving a touch signal from the touch structure during the display panel being in the screen-off state.

In some embodiments, the display apparatus further includes a power supply circuit connected to the texture identification layer, and is further configured to control the power supply circuit to supply power to the texture identification layer in response to receiving a touch signal from the touch structure during the display apparatus being in a screen-off state, and control the power supply circuit to supply power to the texture identification layer in response to receiving a trigger instruction for texture identification and a touch signal from the touch structure during the display apparatus being in a screen-on state, so that the texture identification layer receives reflected light that is reflected to the texture identification layer in light emitted by the light-emitting devices to the outside of the display panel to perform texture identification.

In some embodiments, the apparatus further includes the touch structure disposed in the display panel. Or, the display apparatus further includes a cover sheet and the touch control structure disposed on a surface of the cover sheet facing the base.

In yet another aspect, a method of controlling the display apparatus is provided. the method includes: determining whether the display apparatus is in a screen-off stete, and if the display apparatus is in the screen-off state: receiving a touch signal from the touch structure; controlling the auxiliary light-emitting devices to emit light, so that the texture identification layer receives reflected light that is reflected to the texture identification layer in light emitted by the auxiliary light-emitting devices to an outside of the display apparatus to perform texture identification.

In some embodiments, the method further includes: after determining that the display apparatus is in the screen-off state: controlling a power supply circuit to supply power to the texture identification layer; or after determining that the display apparatus is in a screen-on state: receiving a trigger instruction for texture identification and a touch signal from the touch structure; and controlling the power supply circuit to supply power to the texture identification layer, so as to perform texture identification.

BRIEF DESCRIPTION OF THE DRAWINGS

In order to describe technical solutions in the embodiments of the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, accompanying drawings in the following description may be regarded as schematic diagrams, and are not limitations on an actual size of a product, an actual process of a method and an actual timing of signals that the embodiments of the present disclosure relate to.

DETAILED DESCRIPTION

Figure 1:
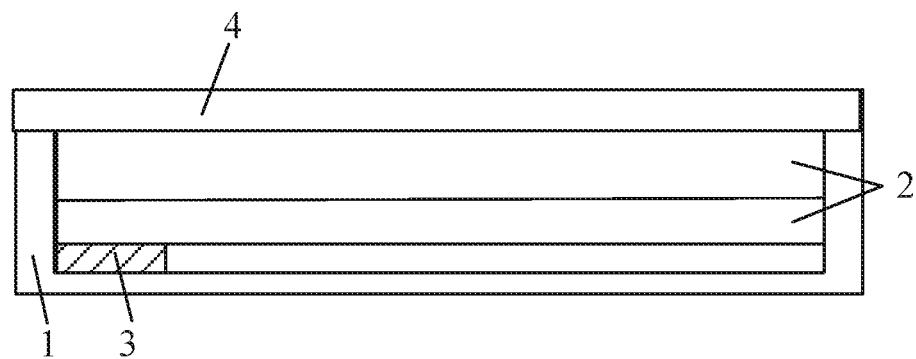
FIG. 1 is a schematic diagram of a display apparatus, in accordance with some embodiments.

Technical solutions in some embodiments of the present disclosure will be described clearly and completely with reference to accompanying drawings. Obviously, the described embodiments are merely some but not all of the embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the specification and the claims are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are only used for describing purposes and cannot be construed as indicating or implying relative importance or implicitly indicating the number of indicated technical features below. Thus, features defined as "first" and "second" may explicitly or implicitly include one or a plurality of the features. In the description of the embodiments of the present disclosure, the term "a/the plurality of" means two or more unless otherwise specified.

In the description of some embodiments, the expressions "connected" and its extensions may be used. For example, term "connected" may be used in the description of some embodiments to indicate that two or more components are in direct physical or electrical contact with each other. However, the term "connected" may also mean that two or more components are not in direct contact with each other but still cooperate or interact with each other. The embodiments disclosed herein are not necessarily limited to the contents herein.

The expression of A and/or B includes the following combinations: only A, only B, and A and B.

In the optical fingerprint identification, capacitive fingerprint identification and ultrasonic fingerprint identification technologies, the capacitive fingerprint identification technology has its limits, and thus the capacitive sensor can only be disposed on the screen; and for the ultrasonic fingerprint identification technology, an ultrasonic emission device needs to be additionally provided in the screen, and may occupy a certain space of the screen.

With the development of display technology, the current display apparatuses, such as mobile phones and tablet computers, are increasingly moving towards a trend of full screen, so that an ultra-thin display apparatus with a high screen-to-body ratio is an inevitable trend in future. Since the optical fingerprint identification technology may be applied to off-screen fingerprint identification, the optical fingerprint identification technology has obvious advantages.

In the related art, display apparatuses based on an off-screen fingerprint identification technology mainly include an organic light-emitting diode (OLED) display apparatus, and the fingerprint identification is achieved by the light emitted by light-emitting devices of the OLED display apparatus. In this way, the fingerprint identification may be performed only when the light-emitting devices emits light. If the OLED display apparatus is in a screen-off state, the fingerprint identification cannot be performed.

Some embodiments of the present disclosure provide a display apparatus. The display apparatus is, for example, a mobile phone, a tablet computer, a personal digital assistant (PDA), a vehicle-mounted computer or the like, and the display apparatus is not limited thereto.

The display apparatus is, for example, an organic light-emitting diode (OLED) display apparatus, a quantum dot light-emitting Diode (QLED) display apparatus or the like.

As shown in FIG. 1, the display apparatus includes, for example, a frame 1, a display panel 2, a circuit board 3, a cover sheet 4, and other electronic components such as a camera.

The display panel 2 may be a top-emitting display panel or bottom-emitting display panel, and the top-emitting display panel is taken as an example for description below. In this case, for example, as shwon in FIG. 1, the frame 1 is a U-shaped frame. The display panel 2 and the circuit board 3 are disposed in the frame 1, and the cover sheet 4 is disposed on a light exit side of the display panel 2 and constructs a seal structure with the frame 1. The circuit board 3 is disposed at a side of the display panel 2 away from the cover sheet 4.

The circuit board 3 is configured to provide signals required for display to the display panel 2. For example, the circuit board 3 is a printed circuit board assembly (PCBA). The PCBA includes, for example, a printed circuit board (PCB), and a timing controller (TCON), a power management integrated circuit (PMIC), other integrated circuits (ICs) or circuits that are disposed on the PCB.

Figure 2A:
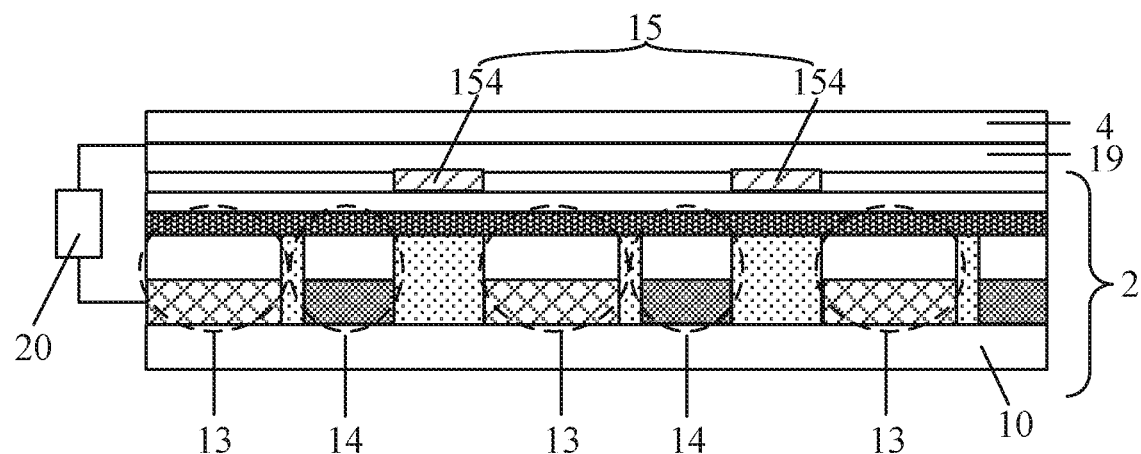
FIG. 2A is a schematic diagram of another display apparatus, in accordance with some embodiments.
Figure 2B:
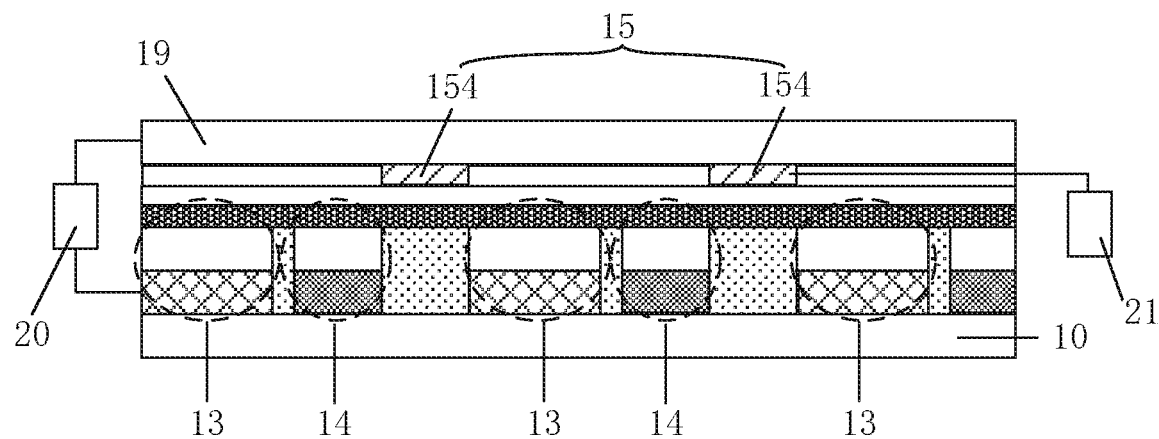
FIG. 2B is a schematic diagram of yet another display apparatus, in accordance with some embodiments.

In some embodiments, as shown in FIGS. 2A and 2B, the display panel 2 includes a base 10, and light-emitting devices 13, auxiliary light-emitting devices 14 and a texture identification layer 15 that are disposed on the base 10.

Herein, that "A is disposed on B" may means that A is directly touching (i.e., in contact with) B, or there is one or more layers between A and B.

The light-emitting devices 13 are configured to emit light required for display.

Figure 13:
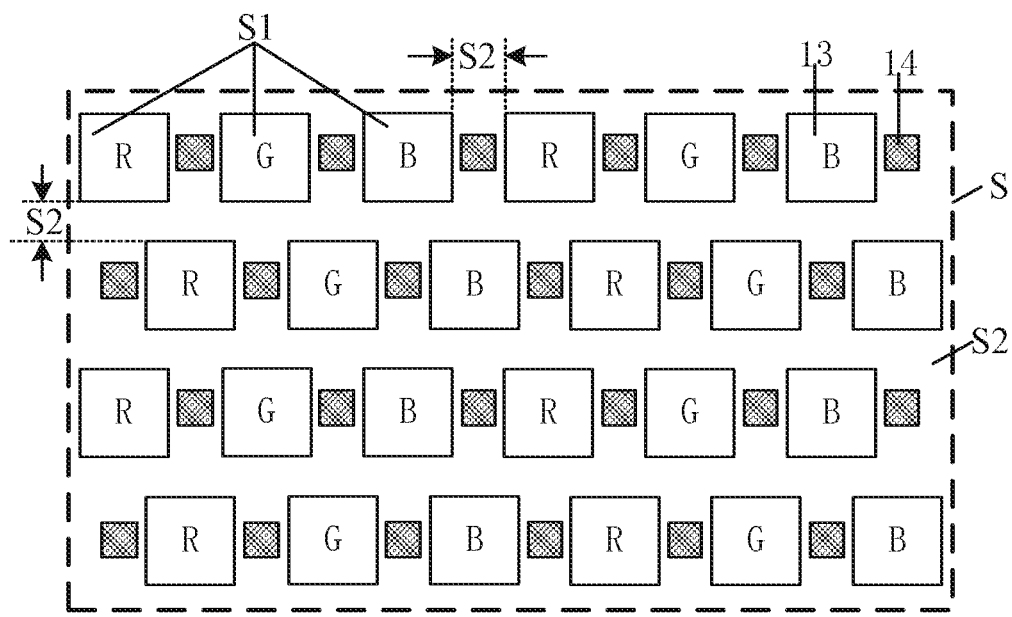
FIG. 13 is a top view of yet another display apparatus, in accordance with some embodiments.

In some embodiments, as shown in FIG. 13, the display panel 2 has a display area S. The display area S includes a plurality of sub-pixel regions S1 and a non-sub-pixel region S2. For example, the plurality of sub-pixel regions S1 are in one-to-one correspondence with the plurality of sub-pixels, and the sub-pixel region is a region in which a sub-pixel is located. The non-sub-pixel region S2 is a region of the display area S except for sub-pixel regions S1. Each light-emitting device 13 is located in a respective one of the plurality of sub-pixel regions S1.

The auxiliary light-emitting device 14 has a same light-emitting direction as the light-emitting devices 13. The auxiliary light-emitting device 14 is configured to emit light in response to receiving a control signal during the display panel 2 being in a screen-off state.

The screen-off state means that the display panel 2 is not turned off but the display surface of the display panel 2 is dark in a whole. That is, the display panel 2 is in a state that can trigger the display panel 2 suspension, placing parts of the dispply panel 2 in a low-power or off state.

The texture identification layer 15 is configured to receive reflected light that is reflected to the texture identification layer 15 in light emitted by the auxiliary light-emitting devices 14 to the outside of the display panel, so as to perform texture identification.

It will be noted that, positions of the auxiliary light-emitting devices 14 and the texture identification layer 15 are not limited, as long as the functions of the auxiliary light-emitting devices 14 and the texture identification layer 15 can be performed.

In addition, as shown in FIGS. 2A and 2B, the display apparatus further includes a control component 20 in the frame 1, and the control component 20 is electrically connected to the auxiliary light-emitting devices 14 and a touch structure 19. The control component 20 may be integrated on the circuit board 3 or may be disposed independently from the circuit board 3.

The control component 20 is configured to control the auxiliary light-emitting devices 14 to emit light in response to receiving a touch signal from the touch structure 19 during the display panel 2 being in the screen-off state.

For example, the control component 20 determines that the display panel 2 is in the screen-off state by receiving a signal. For another example, the control component 20 determines that the display panel 2 is in the screen-off state after a period in which the control compents 20 does not receive any operation signal. Of course, the control component 20 may use other method to deterimine that the display panel 2 is in the screen-off state.

The control component 20 may be a microprocess, a central processing unit (CPU), or any other general-purpose processor, a digital signal processor (DSP), an application specific integrated circuit (ASIC), a field programmable gate array (FPGA), or any other programmable logic device.

The principle of the texture identification of the display apparatus in the screen-off state is that, when the touch structure 19 senses an object to be detected (an object having a texture, for example, a finger, a palm, etc., hereinafter referred to as a finger) that is touching the display apparatus, the touch structure 19 sends a touch signal to the control component 20. The control component 20 controls the auxiliary light-emitting devices 14 to emit light in response to receiving the touch signal from the touch structure 19. The light emitted by the auxiliary light-emitting devices 14 travels to the outside of the display apparatus, a portion of which is reflected by the finger, and the light reflected by the finger then reaches the texture identification layer 15. The texture identification layer 15 receives the reflected light, converts optical signals into electrical signals, and outputs the electrical signals. For example, the texture identification layer 15 sends the electrical signals to a texture identification circuit connected to the texture identification layer 15, and the texture identification circuit obtains a texture image according to the received electrical signals, and compares the texture image with a texture image pre-stored in the display apparatus to perform the texture identification. In some embodiments, the display apparatus further includes the texture identification circuit. For example, the texture identification circuit is a integrated circuit (IC) for texture identification. The texture identification circuit may be integrated on the circuit board 3 or may be disposed independently from the circuit board 3.

In some embodiments, The control component 20 is further configured to control the texture identification layer 15 to receive the reflected light in response to receiving the touch signal from the touch structure 19 during the display panel 2 being in the screen-off state.

For example, as shown in FIG. 2B, the display apparatus further includes a power supply circuit 21 connected to the texture identification layer 15. The control component 20 is further electrically connected to the power supply circuit 21, and is further configured to control the power supply circuit 21 to supply power to the texture identification layer 15 in response to receiving the touch signal from the touch structure 19 during the display panel 2 being in the screen-off state, so that the texture identification layer 15 works normally, receives reflected light that is reflected to the texture identification layer 15 in light emitted by the light-emitting devices 13 to the outside of the display panel 2, and converts optical signals into electrical signals to perform texture identification. For example, the power supply circuit 21 is a integrated circuit (IC), and is configured to control whether the power is supplied to the texture identification layer 15. The power supply circuit 21 may be integrated on the circuit board 3 or may be disposed independently from the circuit board 3.

The control component 20 controls the power supply circuit 21 to supply power to the texture identification layer 15 while controlling the auxiliary light-emitting devices 14 to emit light, so that the texture identification layer 15 may receive the reflected light, convert the optical signals into the electrical signals, and output the electrical signals. The control component 20 is further configured to disconnect the connection between the power supply circuit 21 and the texture identification layer 15 after the fingerprint detection is completed. In this way, there is no need to supply power to the texture identification layer 15 all the time, thereby saving power consumption and avoiding misidentification.

In some embodiments, The control component 20 is further configured to, in response to receiving a trigger instruction for texture identification and a touch signal from the touch structure 19 during the display panel being in a screen-on state, control the power supply circuit 21 to supply power to the texture identification layer 15, so that the texture identification layer 15 receives reflected light that is reflected to the texture identification layer 15 in light emitted by the light-emitting devices 13 to the outside of the display panel to perform texture identification.

The principle of the texture identification of the display apparatus in the screen-on state is that, when the control component 20 receives the trigger instruction for the texture identification (such as a fingerprint payment instruction) and the touch signal from the the touch structure 19 when the touch structure 19 senses a finger touch, the control component 20 controls the power supply circuit 21 to supply power to the texture identification layer 15. The light emitted by the light-emitting devices 13 travels to the outside of the display panel, a portion of which is reflected by the finger, and the light reflected by the finger then reaches the texture identification layer 15. The texture identification layer 15 receives the reflected light, converts optical signals into electrical signals, and outputs the electrical signals. For example, the texture identification layer 15 may send the electrical signals to the texture identification circuit 21 connected to the texture identification layer 15, and the texture identification circuit 21 obtains a texture image according to the received electrical signals, and compares the texture image with a texture image pre-stored in the display apparatus to perform the texture identification.

Of course, when the control component 20 receives the trigger instruction for the texture identification and the touch signal from the touch structure 19, the control component 20 may also control the auxiliary light-emitting devices 14 to emit light. In this case, the reflected light received by the texture identification layer 15 includes a portion of light emitted by the light-emitting devices 13, which is reflected back to the texture identification layer 15, and a portion of light emitted by the auxiliary light-emitting devices 14, which is reflected back to the texture identification layer 15.

Light emitted by any one light-emitting device 13 or any one auxiliary light-emitting device 14 to the outside of the display panel 2 directly enters the air if the light is not reflected by the finger, and the light will not be reflected back to the display panel 2 again. In this case, the light will not reach the texture identification layer 15, and thus the texture identification will not be affected by the light.

In the display apparatus provided by some embodiments of the present disclosure, the auxiliary light-emitting devices 14 are provided and controlled to emit light when the display panel 2 is in the screen-off state. The light emitted by the auxiliary light-emitting device 14 travels to the outside of the display apparatus and then a portion of the light is reflected by a finger to the texture identification layer 15, so that the texture identification may also be achieved when the display panel 2 is in the screen-off state.

In some embodiments, as shown in FIGS. 2A and 2B, the display apparatus further includes the touch structure 19. In some examples, the touch structure 19 is integrated inside the display panel 2. In this case, the touch structure 19 is disposed, for example, above the base 10. In some other examples, as shown in FIGS. 2A and 2B, the touch structure 19 is disposed at a light exit side of the display panel 2. In this case, the touch structure 19 is disposed on, for example, a surface of the cover sheet 4 facing the base 10.

In some other embodiments, the touch structure 19 is an additional structure. For example, the touch structure 19 is attached to a light exit surface of the display apparatus.

In some embodiments, the auxiliary light-emitting devices 14 are located in the non-sub-pixel region S2.

In some embodiments, the light emitted by the auxiliary light-emitting devices 14 is visible light, such as red light or blue light, etc. In some other embodiments, the light emitted by the auxiliary light-emitting devices 14 is invisible light, such as infrared light. In this way, even if the display apparatus is in the screen-on state, the display effect of the display apparatus will not be affected by the light emitted by the auxiliary light-emitting devices 14.

In some embodiments, the positional relationship between the auxiliary light-emitting devices 14 and the light-emitting devices 13 has the following three possible implementations.

First Possible Implementation

As shown in FIGS. 3 to 7 and 10 to 12, layers where the auxiliary light-emitting devices 14 are located and layers where the light-emitting devices 13 are located are same layers, and each auxiliary light-emitting device 14 is disposed between two adjacent light-emitting devices 13.

Here, that "layers where the auxiliary light-emitting devices 14 are located and layers where the light-emitting devices 13 are located are same layers" means that the auxiliary light-emitting device 14 includes a plurality auxiliary layers, the light-emitting device 13 includes a plurality of layers, and each auxiliary layer and a respective one of the plurality of layers are in a same layer.

For example, both the auxiliary light-emitting device 14 and the light-emitting device 13 are of a three-layer structure. A cathode of the auxiliary light-emitting device 14 and a cathode of the light-emitting device 13 are disposed in a same layer (for example, the cathode of the auxiliary light-emitting device 14 and the cathode of the light-emitting device 13 are formed through a same patterning process), an auxiliary light-emitting layer of the auxiliary light-emitting device 14 and a light-emitting layer of the light-emitting device 13 are disposed in a same layer (for example, the auxiliary light-emitting layer of the auxiliary light-emitting device 14 and the light-emitting layer of the light-emitting device 13 are formed through a same patterning process), and an anode of the auxiliary light-emitting device 14 and an anode of the light-emitting device 13 are disposed in a same layer (for example, the anode of the auxiliary light-emitting device 14 and the anode of the light-emitting device 13 are formed through a same patterning process). In this way, the auxiliary light-emitting device 14 and the light-emitting device 13 may be synchronously manufactured, which simplifies the manufacturing process of the display apparatus. It will be noted that, the patterning process may include multiple exposure, developing or etching processes. The specific patterns in the layer structure may be continuous or discontinuous, and the specific patterns may be at different heights or may have different thicknesses.

There is a gap between the auxiliary light-emitting device 14 and its adjacent light-emitting device 13, so as to avoid a short circuit therebetween. For example, as shown in FIGS. 3 to 7, the display panel 2 further includes a pixel defining layer 17, and the auxiliary light-emitting device 14 and its adjacent light-emitting device 13 are spaced apart by a portion of the pixel defining layer 17.

Structures of other components in the display panel 2 in this possble implementation are described below by examples.

Figure 5:
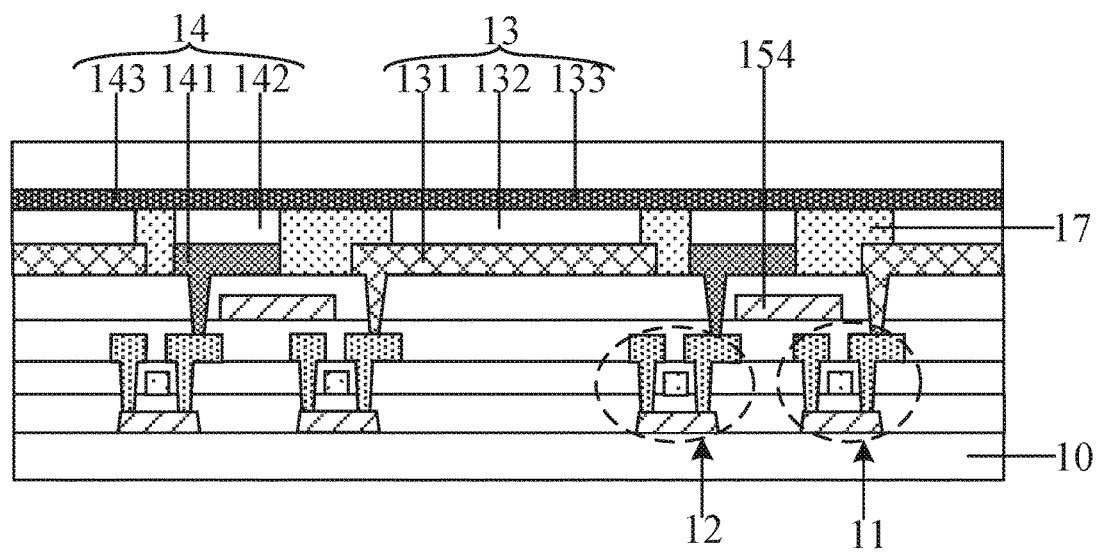
FIG. 5 is a schematic diagram of yet another display apparatus, in accordance with some embodiments of the present disclosure.
Figure 6:
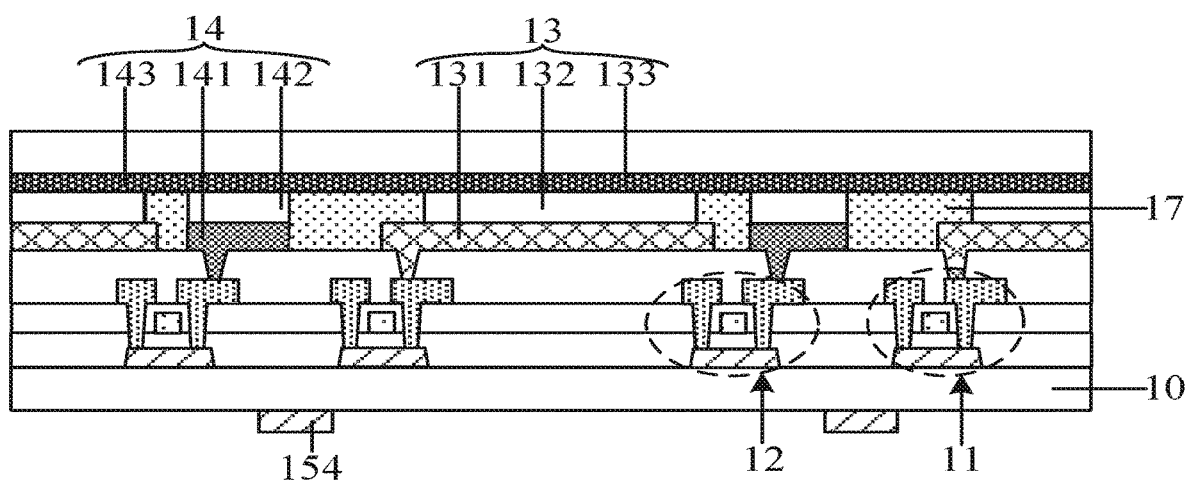
FIG. 6 is a schematic diagram of yet another display apparatus, in accordance with some embodiments.
Figure 7:
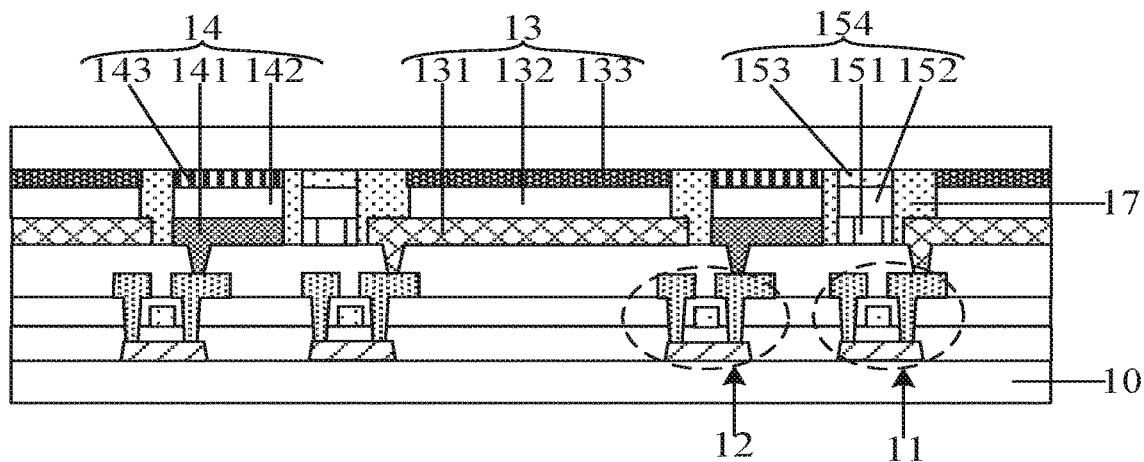
FIG. 7 is a schematic diagram of yet another display apparatus, in accordance with some embodiments.

In some embodiments, as shown in FIGS. 3 to 7, the texture identification layer 15 includes texture identification units 154. For example, as shown in FIG. 7, the texture identification unit 154 is a photodiode, and the photodiode includes a P layer 151, a photosensitive material layer 152, and an N layer 153 that are sequentially stacked above the base 10.

Figure 3:
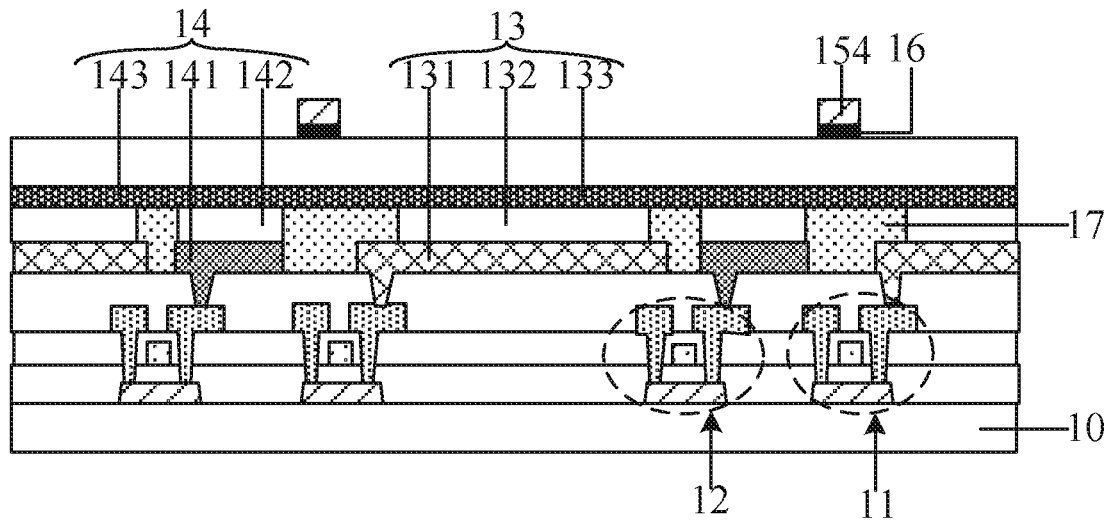
FIG. 3 is a schematic diagram of yet another display apparatus, in accordance with some embodiments.

As shown in FIG. 3, the texture identification units 154 may be disposed at a side of the auxiliary light-emitting devices 14 away from the base 10 (that is, the texture identification layer 15 is disposed at a side of the auxiliary light-emitting devices 14 away from the base 10), and orthographic projections of the texture identification units 154 on the base 10 are non-overlapping with orthographic projections of the auxiliary light-emitting devices 14 on the base 10 and orthographic projections of the light-emitting devices 13 on the base 10.

In this case, in some embodiments, as shown in FIG. 3, the display panel 2 further includes light-shielding patterns 16 disposed on surfaces of the texture identification units 154 facing the base 10. The light-shielding patterns 16 are in one-to-one correspondence with the texture identification units 154, and an orthographic projection of one of the texture recognition units 154 on the base 10 is located within a range of an orthographic projection of a corresponding light-shielding pattern 16 on the base 10. For example, the orthographic projection of each texture identification unit 154 on the base 10 is located within the range of the orthographic projection of a corresponding light-shielding pattern 16 on the base 10.

In this way, the light emitted by the light-emitting devices 13 and/or the auxiliary light-emitting devices 14 may be prevented from directly reaching the texture identification layer 15 inside the display panel 2, which may interfere with the light reflected by the finger to the texture identification layer 15, thereby improving the accuracy of texture identification.

Figure 4:
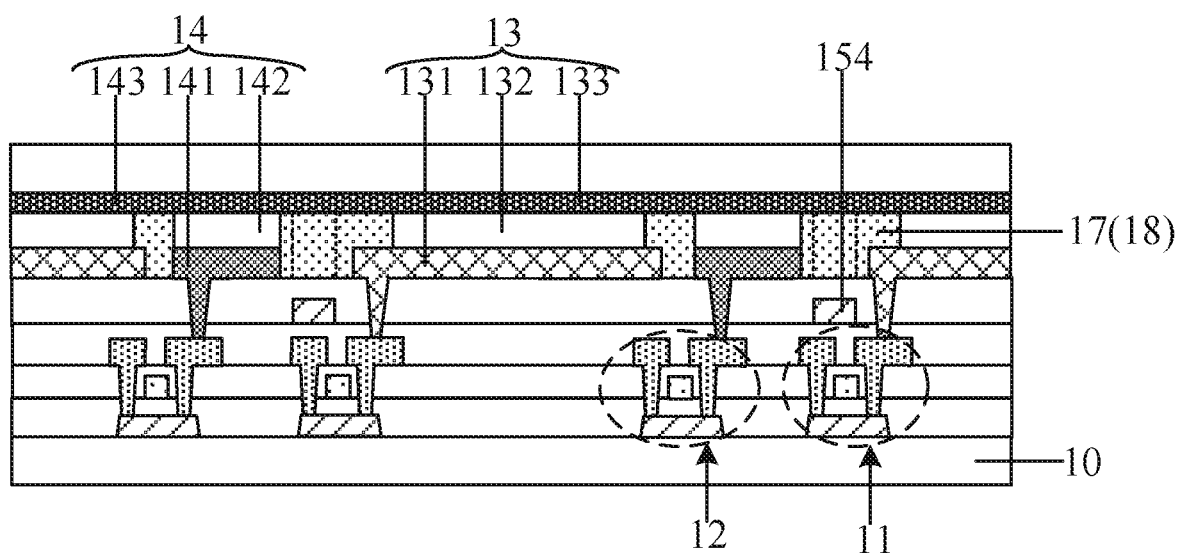
FIG. 4 is a schematic diagram of yet another display apparatus, in accordance with some embodiments.

As shown in FIGS. 4 and 5, the texture identification units 154 may be disposed between the auxiliary light-emitting devices 14 and the base 10 (that is, the texture identification layer 15 is disposed between the auxiliary light-emitting devices 14 and the base 10).

As shown in FIG. 6, the texture identification units 154 may be disposed at a side of the base 10 away from the auxiliary light-emitting devices 14. For example, as shown in FIG. 6, the texture identification units 154 are disposed on a surface of the base 10 facing away from the auxiliary light-emitting devices 14. For another example, one or more layers are disposed on a surface of the base 10 facing away from the auxiliary light-emitting devices 14, and the texture identification units 154 are disposed on a surface of the one or more layers that is farthest from the base 10.

As shown in FIG. 7, the texture identification units 154 may be disposed in same layers as the auxiliary light-emitting devices 14 and the light-emitting devices 13. That is, each of the three layers of the the texture identification unit 154 is disposed in a same layer as a respective one of three layers of the auxiliary light-emitting devices 14 and a respective one of three layers of the light-emitting devices 13. In this case, orthographic projections of the texture identification units 154 on the base 10 are non-overlapping with orthographic projections of the auxiliary light-emitting devices 14 on the base 10 and orthographic projections of the light-emitting devices 13 on the base 10.

The positional relationship between the texture identification units 154 and the auxiliary light-emitting devices 14 is described below by examples in a case where the texture identification units 154 is disposed between the auxiliary light-emitting devices 14 and the base 10 as shown in FIGS. 4 and 5 or the texture identification units 154 is disposed at a side of the base 10 away from the auxiliary light-emitting devices 14 as shown in FIG. 6.

Figure 10:
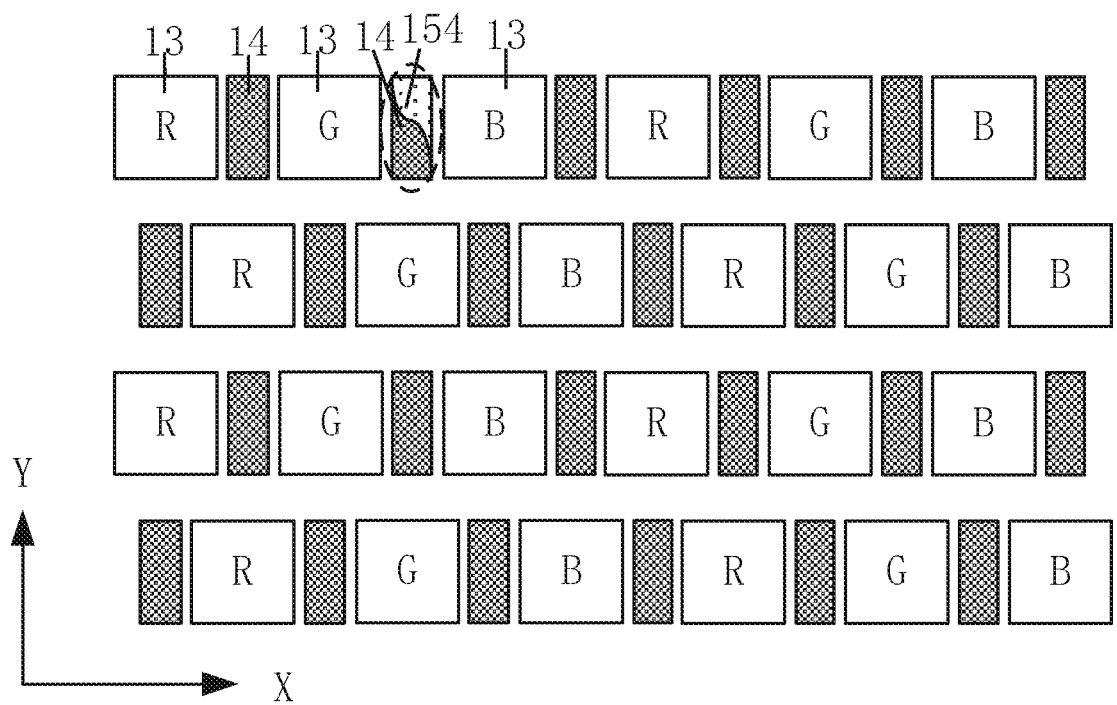
FIG. 10 is a top view of a display apparatus, in accordance with some embodiments.

In some examples, the auxiliary light-emitting devices 14 are light-transmissive devices. As shown in FIGS. 5, 6 and 10, an orthographic projection of one of the auxiliary light-emitting devices 14 on the base 10 overlaps an orthographic projection of a corresponding texture identification unit 154 on the base 10. For example, an orthographic projection of each auxiliary light-emitting device on the base 10 overlaps an orthographic projection of a corresponding texture identification unit 154 on the base 10.

It will be noted that, in the top view of the display apparatus shown in FIG. 10, since the orthographic projection of the auxiliary light-emitting device 14 overlaps the orthographic projection of the corresponding texture identification unit 154, FIG. 10 illustrates the positional relationship between the auxiliary light-emitting device 14 and the texture identification unit 154 only at the position indicated by the dotted line.

In this way, after light emitted by the auxiliary light-emitting device 14 is reflected by the finger, the reflected light passes through the auxiliary light-emitting device 14, and then may vertically travel to the corresponding texture identification unit 154, thereby facilitating to improve the accuracy and sensitivity of texture identification.

For example, as shown in FIG. 10, the light-emitting devices 13 and the auxiliary light-emitting devices 14 are alternately arranged along a row direction (X direction).

Figure 11:
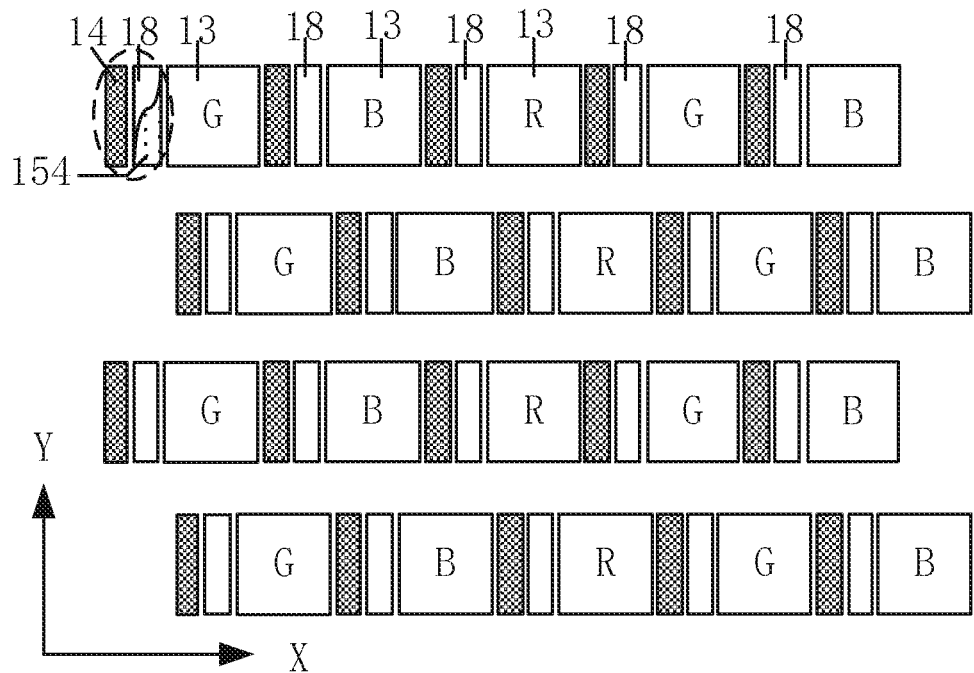
FIG. 11 is a top view of another display apparatus, in accordance with some embodiments.
Figure 12:
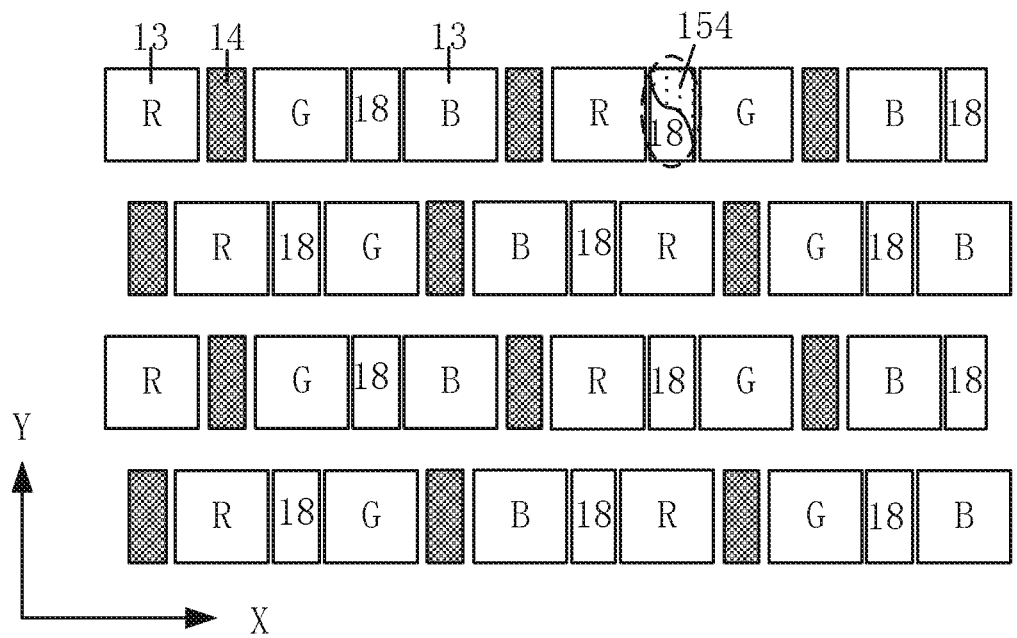
FIG. 12 is a top view of yet another display apparatus, in accordance with some embodiments.

In some other examples, the auxiliary light-emitting devices 14 are opaque devices, and as shown in FIG. 4, an orthographic projection of one of the auxiliary light-emitting devices 14 on the base 10 is non-overlapping with an orthographic projection of a corresponding texture identification unit 154 on the base 10. For example, as shown in FIGS. 4, 11 and 12, the display panel further includes light-transmitting units 18, and layers where the light-transmitting units 18 are located and layers where the auxiliary light-emitting devices 14 are located are the same layers. An orthographic projection of the light-transmitting unit 18 on the base 10 overlaps an orthographic projection of a corresponding texture identification unit 154 on the base 10. Each light-transmitting unit 18 is disposed between two adjacent light-emitting devices 13 (e.g., FIG. 12) and/or between a auxiliary light-emitting device 14 and a light-emitting device 13 that are adjacent (e.g., FIG. 11).

For example, as shown in FIG. 11, the light-transmitting units 18, the light-emitting devices 13, and the auxiliary light-emitting devices 14 are alternately arranged in sequence along the row direction (X direction). For another example, as shown in FIG. 12, each light-transmitting unit 18 is located between two adjacent light-emitting devices 13, each auxiliary light-emitting device 14 is also located between two adjacent light-emitting devices 13, and the light-transmitting unit 18 and the auxiliary light-emitting device 14 are not adjacent.

The distribution manner of the light-transmitting units 18 is not limited thereto, as long as it is helpful for the texture identification units 154 to receive the reflected light accurately.

A portion of the transparent pixel defining layer may serve as the light-transmitting unit 18. That is, the portion of the transparent pixel defining layer between two adjacent sub-pixels is the light-transmitting unit 18.

In this way, after light emitted by the auxiliary light-emitting device 14 is reflected by the finger, the reflected light may travel to the corresponding texture identification unit 154 through the light-transmitting unit 18.

It will be noted that, in the top view of the display apparatus shown in FIGS. 11 and 12, since the orthographic projection of the light-transmitting unit 18 overlaps the orthographic projection of the corresponding texture identification unit 154, FIGS. 11 and 12 illustrate the positional relationship between the light-transmitting unit 18 and the texture identification unit 154 only at the position indicated by the dotted lines.

Second Possible Implementation

Figure 8:
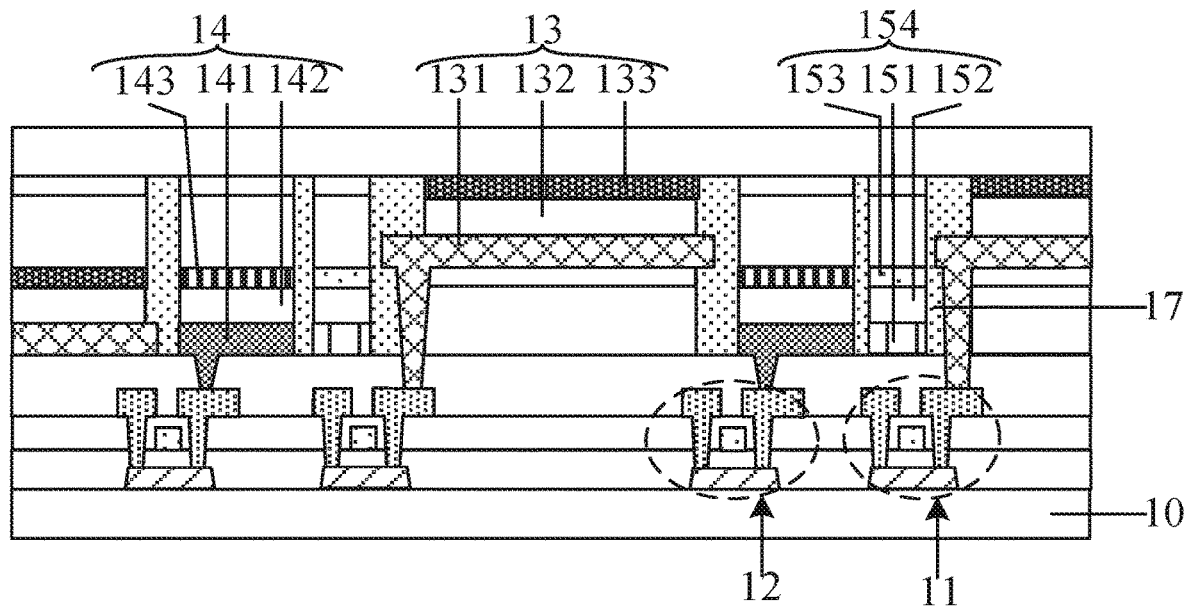
FIG. 8 is a schematic diagram of yet another display apparatus, in accordance with some embodiments.

As shown in FIG. 8, the auxiliary light-emitting devices 14 are disposed between the light-emitting devices 13 and the base 10 (that is, the auxiliary light-emitting device layers including the auxiliary light-emitting devices 14 as a whole are disposed between the light-emitting devices 13 and the base 10). For example, one auxiliary light-emitting device 14 of the auxiliary light-emitting devices 14 corresponds at least to a gap between two adjacent light-emitting devices 13 in the thickness direction of the base 10. For example, each auxiliary light-emitting device 14 corresponds at least to a gap between two adjacent light-emitting devices 13 in the thickness direction of the base 10.

For example, as shown in FIG. 8, orthographic projections of the auxiliary light-emitting devices 14 on the base 10 are non-overlapping with orthographic projections of the light-emitting devices 13 on the base 10. That is, each auxiliary light-emitting device 14 is disposed in the non-sub-pixel region. In this case, the auxiliary light-emitting devices 14 are, for example, opaque devices or light-transmissive devices.

For another example, an orthographic projection of each auxiliary light-emitting device 14 on the base 10 overlaps orthographic projections of a gap between two adjacent light-emitting devices 13 and at least one light-emitting device 13 of the two adjacent light-emitting devices 13 on the base 10. That is, the auxiliary light-emitting device 14 is located in both the non-sub-pixel region and the sub-pixel region. In this case, the auxiliary light-emitting devices 14 are, for example, light-transmissive devices.

Third Possible Implementation

Figure 9:
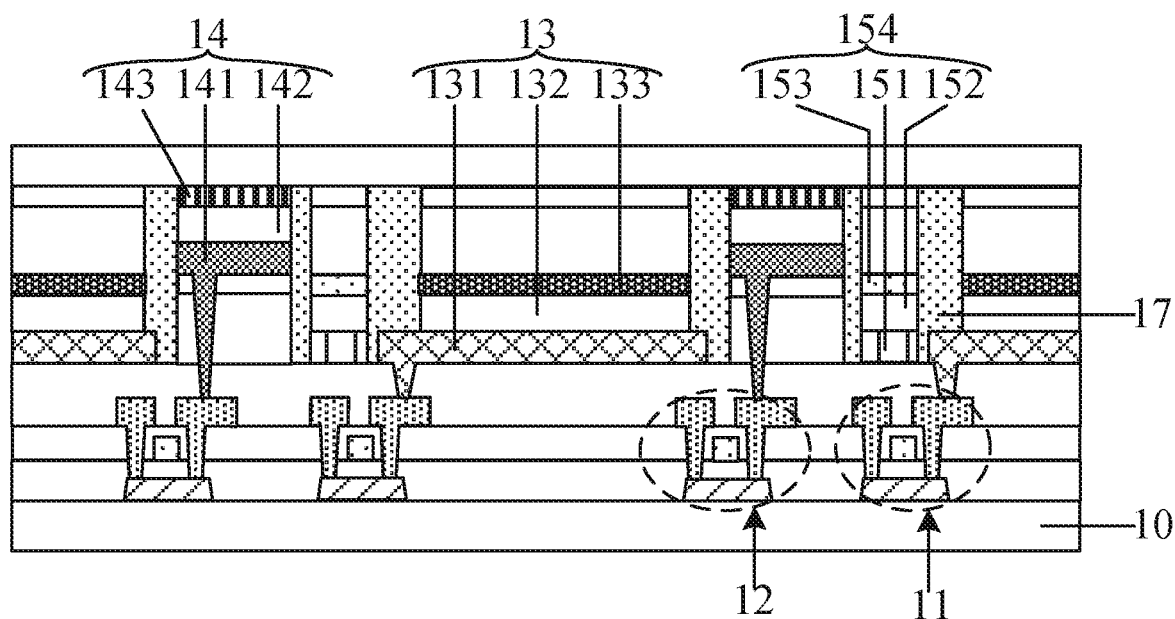
FIG. 9 is a schematic diagram of yet another display apparatus, in accordance with some embodiments.

As shown in FIG. 9, the auxiliary light-emitting devices 14 are disposed at a side of the light-emitting devices 13 away from the base 10 (that is, the auxiliary light-emitting device layers including the auxiliary light-emitting devices 14 as a whole are disposed at a side of the light-emitting devices 13 away from the base 10). For example, one auxiliary light-emitting device 14 of the auxiliary light-emitting devices 14 corresponds at least to a gap between two adjacent light-emitting devices 13. For example, each auxiliary light-emitting device 14 corresponds at least to a gap between two adjacent light-emitting devices 13.

For example, as shown in FIG. 9, orthographic projections of the auxiliary light-emitting devices 14 on the base 10 are non-overlapping with orthographic projections of the light-emitting devices 13 on the base 10. That is, each auxiliary light-emitting device 14 is disposed in the non-sub-pixel region. For example, the auxiliary light-emitting devices 14 are opaque devices or light-transmissive devices.

For another example, orthographic projection of each auxiliary light-emitting device 14 on the base 10 overlaps orthographic projections of a gap between two adjacent light-emitting devices 13 and at least one light-emitting device of the two adjacent light-emitting devices 13 on the base 10. That is, the auxiliary light-emitting device 14 is located in both the non-sub-pixel region and the sub-pixel region. In this case, the auxiliary light-emitting devices 14 are, for example, light-transmissive devices.

The display panels are described below in detail by providing several examples in an implementation where the auxiliary light-emitting devices 14 are opaque devices and another implementation where auxiliary light-emitting devices 14 are light-transmissive devices.

Opaque Auxiliary Light-Emitting Devices

In some examples, as shown in FIGS. 3 to 4, 6 and 7, layers where the auxiliary light-emitting devices 14 are located and layers where the light-emitting devices 13 are located are same layers, and each auxiliary light-emitting device 14 is disposed between two adjacent light-emitting devices 13.

In this case, as shown in FIG. 3, the texture identification units 154 may be disposed at a side of the auxiliary light-emitting devices 14 away from the base 10, and an orthographic projection of each texture identification unit 154 on the base 10 is in a range of an orthographic projection of a gap between a light-emitting device 13 and an auxiliary light-emitting device 14 that are adjacent on the base 10. Or, as shown in FIG. 4, the texture identification units 154 may be disposed between the auxiliary light-emitting devices 14 and the base 10, and an orthographic projection of each texture identification unit 154 on tha base 10 is in a range of an orthographic projection of a gap between a light-emitting device 13 and an auxiliary light-emitting device 14 that are adjacent on the base 10. Or, as shown in FIG. 6, the texture identification units 154 may be disposed on a surface of the base 10 facing away from the auxiliary light-emitting devices 14, and an orthographic projection of each texture identification unit 154 on the base 10 is in a range of an orthographic projection of a gap between a light-emitting device 13 and an auxiliary light-emitting device 14 that are adjacent on the base 10. Or, as shown in FIG. 7, the texture identification units 154 may be disposed in same layers as the auxiliary light-emitting devices 14.

In some other examples, as shown in FIG. 8, the auxiliary light-emitting devices 14 are disposed between the light-emitting devices 13 and the base 10, and an orthographic projection of each auxiliary light-emitting device 14 on the base 10 is non-overlapping with orthographic projections of the two adjacent light-emitting devices 13 on the base 10.

In this case, the texture identification units 154 may be disposed between the auxiliary light-emitting devices 14 and the base 10, and an orthographic projection of each texture identification unit 154 on tha base 10 is in a range of an orthographic projection of a gap between the light-emitting device 13 and the auxiliary light-emitting device 14 that are adjacent on the base 10. Or, the texture identification units 154 may be disposed at a side of the base 10 away from the auxiliary light-emitting devices 14, and an orthographic projection of each texture identification unit 154 on the base 10 is in a range of an orthographic projection of a gap between the light-emitting device 13 and the auxiliary light-emitting device 14 that are adjacent on the base 10. Or, as shown in FIG. 8, the texture identification units 154 may be disposed in same layers as the auxiliary light-emitting devices 14, and an orthographic projection of each texture identification unit 154 on the base 10 is in a range of an orthographic projection of a gap between the light-emitting device 13 and the auxiliary light-emitting device 14 that are adjacent on the base 10. Or, the texture identification units 154 may be disposed at a side of the auxiliary light-emitting devices 14 away from the base 10, and an orthographic projection of each texture identification unit 154 on the base 10 is in a range of an orthographic projection of a gap between the light-emitting device 13 and the auxiliary light-emitting device 14 that are adjacent on the base 10.

In some other examples, as shown in FIG. 9, the auxiliary light-emitting devices 14 are disposed at a side of the light-emitting devices 13 away from the base 10, and an orthographic projection of each auxiliary light-emitting device 14 on the base 10 is non-overlapping with orthographic projections of the two adjacent light-emitting devices 13 on the base 10.

In this case, the texture identification units 154 may be disposed between the light-emitting devices 13 and the base 10, and an orthographic projection of the texture identification unit 154 on the base 10 is in a range of an orthographic projection of a gap between the light-emitting device 13 and the auxiliary light-emitting device 14 that are adjacent on the base 10. Or, the texture identification units 154 may be disposed on a surface of the base 10 facing away from the auxiliary light-emitting devices 14, and an orthographic projection of each texture identification unit 154 on the base 10 is in a range of an orthographic projection of a gap between the light-emitting device 13 and the auxiliary light-emitting device 14 that are adjacent on the base 10. Or, as shown in FIG. 9, the texture identification units 154 may be disposed in same layers as the light-emitting devices 13, and an orthographic projection of each texture identification unit 154 on the base 10 is in a range of an orthographic projection of a gap between the light-emitting device 13 and the auxiliary light-emitting device 14 that are adjacent on the base 10. Or, the texture identification units 154 may be disposed in same layers as the auxiliary light-emitting devices 14, and an orthographic projection of each texture identification unit 154 on the base 10 is in a range of an orthographic projection of a gap between the light-emitting device 13 and the auxiliary light-emitting device 14 that are adjacent on the base 10. Or, the texture identification units 154 may also be disposed at a side of the auxiliary light-emitting devices 14 away from the base 10, and an orthographic projection of the texture identification unit 154 on the base 10 is in a range of an orthographic projection of a gap between the light-emitting device 13 and the auxiliary light-emitting device 14 that are adjacent on the base 10.

In the above implementations, orthographic projections of the texture identification units 154, the auxiliary light-emitting devices 14, and the light-emitting devices 13 on the base 10 are non-overlapping.

Light-Transmissive Auxiliary Light-Emitting Devices

In some examples, as shown in FIGS. 3, 5, and 7, layers where the auxiliary light-emitting devices 14 are located and layers where the light-emitting devices 13 are located are same layers, and each auxiliary light-emitting device 14 is disposed between two adjacent light-emitting devices 13.

In this case, as shown in FIG. 3, the texture identification units 154 may be disposed at a side of the auxiliary light-emitting devices 14 away from the base 10, and an orthographic projection of each texture identification unit 154 on the base 10 is in a range of an orthographic projection of a gap between the light-emitting device 13 and the auxiliary light-emitting device 14 that are adjacent on the base 10. Or, as shown in FIG. 5, the texture identification units 154 may be disposed between the auxiliary light-emitting devices 14 and the base 10, and an orthographic projection of each auxiliary light-emitting device 14 on the base 10 overlaps an orthographic projection of a corresponding texture identification unit 154 on the base 10. Or, as shown in FIG. 6, the texture identification units 154 may be disposed on a surface of the base 10 facing away from the auxiliary light-emitting devices 14, and an orthographic projection of each auxiliary light-emitting device 14 on the base 10 overlaps an orthographic projection of a corresponding texture identification unit 154 on the base 10. Or, as shown in FIG. 7, the texture identification units 154 may be disposed in same layers as the auxiliary light-emitting devices 14.

In some other examples, as shown in FIG. 8, the auxiliary light-emitting devices 14 are disposed between the light-emitting devices 13 and the base 10, and an orthographic projection of each auxiliary light-emitting device 14 on the base 10 is non-overlapping with orthographic projections of the two adjacent light-emitting devices 13 on the base 10.

In this case, as shown in FIG. 8, the texture identification units 154 may be disposed in same layers as the auxiliary light-emitting devices 14, and an orthographic projection of each texture identification unit 154 on the base 10 is in a range of an orthographic projection of a gap between the light-emitting device 13 and the auxiliary light-emitting device 14 that are adjacent on the base 10. Or, the texture identification units 154 may also be disposed at a side of the auxiliary light-emitting devices 14 away from the base 10, and an orthographic projection of each texture identification unit 154 on the base 10 is in a range of an orthographic projection of a gap between the light-emitting device 13 and the auxiliary light-emitting device 14 that are adjacent on the base 10. Or, the texture identification units 154 may be disposed between the auxiliary light-emitting devices 14 and the base 10, and an orthographic projection of each auxiliary light-emitting device 14 on the base 10 overlaps an orthographic projection of a corresponding texture identification unit 154 on the base 10. Or, the texture identification units 154 may be disposed on a surface of the base 10 facing away from the auxiliary light-emitting devices 14, and an orthographic projection of each auxiliary light-emitting device 14 on the base 10 overlas an orthographic projection of a corresponding texture identification unit 154 on the base 10.

In some other examples, as shown in FIG. 9 the auxiliary light-emitting devices 14 are disposed at a side of the light-emitting devices 13 away from the base 10, and an orthographic projection of each auxiliary light-emitting device 14 on the base 10 is non-overlapping with orthographic projections of the two adjacent light-emitting devices 13 on the base 10.

In this case, as shown in FIG. 9, the texture identification units 154 may be disposed in same layers as the light-emitting devices 13, and an orthographic projection of each texture identification unit 154 on the base 10 is in a range of an orthographic projection of a gap between the light-emitting device 13 and the auxiliary light-emitting device 14 that are adjacent on the base 10. Or, the texture identification units 154 may also be disposed at a side of the auxiliary light-emitting devices 14 away from the base 10, and an orthographic projection of each texture identification unit 154 on the base 10 is in a range of an orthographic projection of a gap between the light-emitting device 13 and the auxiliary light-emitting device 14 that are adjacent on the base 10. Or, the texture identification units 154 may be disposed on a surface of the base 10 facing away from the auxiliary light-emitting devices 14, and an orthographic projection of each auxiliary light-emitting device 14 on the base 10 overlaps an orthographic projection of a corresponding texture identification unit 154 on the base 10.

In some embodiments, a region in which the texture identification layer 15 is located is a texture identification region, and an area of the texture identification region may be less than or equal to that of the display area of the display apparatus.

Figure 14:
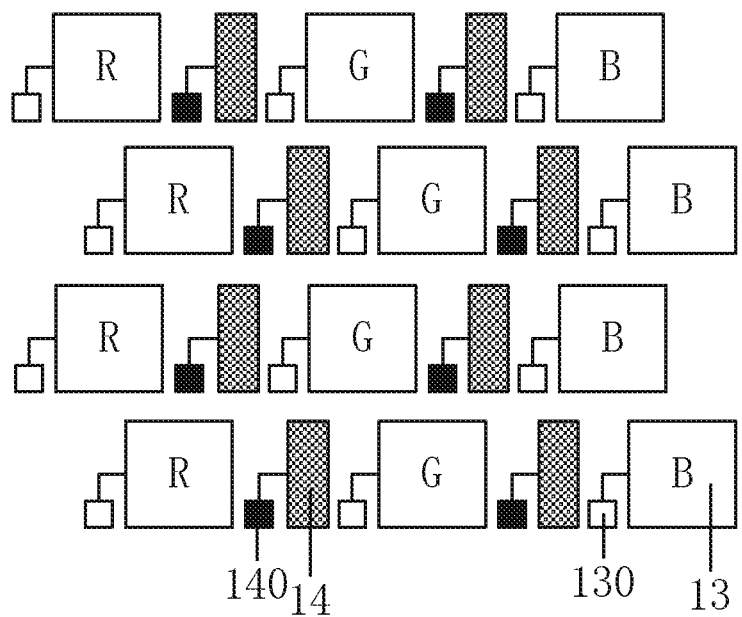
FIG. 14 is a schematic diagram of a correspondence relationship between an auxiliary light-emitting device and a control circuit, in accordance with some embodiments.

In some embodiments, as shown in FIG. 14, the display panel 2 further includes control circuits 140 in one-to-one correspondence with the auxiliary light-emitting devices 14, and each control circuit 140 is configured to control a corresponding auxiliary light-emitting device 14 to emit light.

Each control circuit 140 is electrically connected to the control component 20 and the corresponding auxiliary light-emitting device 14. When fingerprint identification is performed, the touch structure 19 senses the finger touching the display apparatus, and then sends a touch signal to the control component 20. When the control component 20 receives the touch signal sent by the touch structure 19, the control component 20 may control the control circuit 140 to drive the corresponding auxiliary light-emitting device 14 to emit light.

In some embodiments, as shown in FIGS. 3 to 9, one auxiliary light-emitting device 14 of the auxiliary light-emitting devices 14 includes a first electrode 141, an auxiliary light-emitting layer 142, and a second electrode 143 that are sequentially stacked in a thickness direction of the base 10. In this case, the control circuit 140 is electrically connected to the first electrode 141 in the auxiliary light-emitting device 14, and is configured to control the auxiliary light-emitting layer 142 in the auxiliary light-emitting device 14 to emit light.

For example, each auxiliary light-emitting device 14 includes a first electrode 141, an auxiliary light-emitting layer 142, and a second electrode 143 that are sequentially stacked in the thickness direction of the base 10.

In some embodiments, as shown in FIG. 14, the display panel further includes pixel circuits 130 each electrically connected to a respective one of the light-emitting devices 13, and each pixel circuit 130 is configured to control the respective one of the light-emitting devices 13 to emit light.

As shown in FIGS. 3 to 9, the light-emitting device 13 includes a third electrode 131, a light-emitting layer 132, and a fourth electrode 133 that are sequentially stacked in the thickness direction of the base 10. For example, the third electrode 131 is an anode, and the fourth electrode 133 is a cathode. For another example, the third electrode 131 is a cathode, and the fourth electrode 133 is an anode. In this case, the pixel circuit 130 is electrically connected to the third electrode 131 in the light-emitting device 13, and is configured to control the light-emitting layer 132 in the light-emitting device 13 to emit light.

In a case where the light-emitting device 13 is disposed in same layers as the auxiliary light-emitting device 14, as shown in FIGS. 3 to 6, the fourth electrode 133 in the light-emitting device 13 and the second electrode 143 in the auxiliary light-emitting device 14 may be integrated together. When the light-emitting device 13 and the auxiliary light-emitting device 14 are controlled to emit light, a first voltage may be provided to the fourth electrode 133 (or the second electrode 143), and a second voltage and a third voltage may be provided to the third electrode 131 and the first electrode 141 respectively, so that the light-emitting device 13 and the auxiliary light-emitting device 14 may independently emit light.

In a case where the light-emitting device 13 is disposed in the same layers as the auxiliary light-emitting device 14, as shown in FIG. 7, the fourth electrode 133 in the light-emitting device 13 and the second electrode 143 in the auxiliary light-emitting device 14 may be insulated from each other. In this way, the auxiliary light-emitting device 14 may be controlled to emit light by controlling voltages of the second electrode 143 and the first electrode 141, and the light-emitting device 13 may be controlled to emit light by controlling voltages of the fourth electrode 133 and the third electrode 131, so that the auxiliary light-emitting device 14 and the light-emitting device 13 may independently emit light.

In some embodiments, the control circuit 140 may include a switching transistor. In some other embodiments, a circuit structure of the control circuit 140 may be same as that of the pixel circuit 130 used for controlling the light-emitting device 13 to emit light.

For example, the circuit structure of the control circuit 140 is the same as that of the pixel circuit 130. As shown in FIGS. 3 to 9, the pixel circuit 130 includes at least one switching transistor, a first driving transistor 11 and a storage capacitor, and the control circuit 140 includes at least one switching transistor, a second driving transistor 12 and a storage capacitor.

The control circuits 140 may be disposed between the pixel circuits 130 and the base 10. Or, as shown in FIGS. 3 to 9, the control circuits 140 may be disposed in same layers as the pixel circuits 130. That is, the control circuits 140 and the pixel circuits 130 are formed in the same layers. Or, the control circuits 140 may be disposed between the pixel circuits 130 and the auxiliary light-emitting devices 14.

The plurality of sub-pixel regions S1 include rows of sub-pixel regions S1 arranged in a first direction, sub-pixel regions S1 in each row are arranged in a second direction, and the first direction is intersected with the second direction. In order to make a light intensity at each position in the texture identification region consistent, as shown in FIGS. 10 and 12, in some embodiments, a distance between any two adjacent auxiliary light-emitting devices 14 in a second direction (X direction) may be the same, and a distance between any two adjacent auxiliary light-emitting devices 14 in a first direction (Y direction) may be the same. A distance between any two adjacent texture identification units 154 in the second direction (X direction) may be the same, and a distance between any two adjacent texture identification units 154 in the first direction (Y direction) may be the same. FIGS. 10 and 12 illustrate an example in which the shape of the orthographic projection of the auxiliary light-emitting device 14 on the base 10 is a rectangle. The shape of the orthographic projection of the auxiliary light-emitting device 14 on the base 10 may also be a circle, and is not limited thereto.

In this case, as shown in FIGS. 10 and 12, in any two adjacent rows of sub-pixel regions S1, lines extending in the first direction passes through a sub-pixel region S1 in an even row and a region between two adjacent sub-pixel regions S1 in an odd row, and the two adjacent sub-pixel regions S1 in the odd row are adjacent to the sub-pixel region S1 in the even row.

There is a preset gap between two adjacent rows of the sub-pixel regions S1 and a length of each auxiliary light-emitting device 14 in the second direction and a width of the auxiliary light-emitting device 14 in the first direction are both equal to a width of the preset gap in the first direction. In this way, the uniformity of light of the auxiliary light-emitting devices 14 may be improved.

Figure 15:
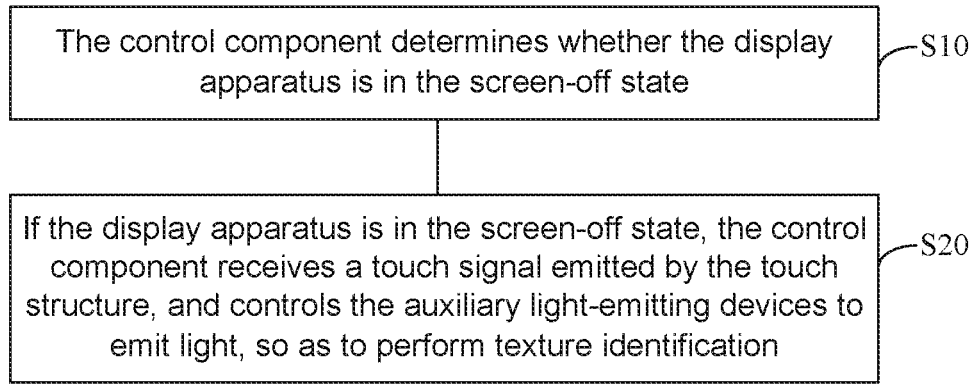
FIG. 15 is a flow diagram of a method of controlling a display apparatus, in accordance with some embodiments.

Some embodiments of the present disclosure provide a method of controlling the display apparatus, which is performed by the control component in the display apparatus in the above embodiments. As shown in FIG. 15, the method includes the following step.

In S10, the control component determines whether the display apparatus is in the screen-off state.

In S20, if the display apparatus is in the screen-off state, the control component receives a touch signal emitted by the touch structure, and controls the auxiliary light-emitting devices to emit light, so as to perform texture identification.

Figure 16:
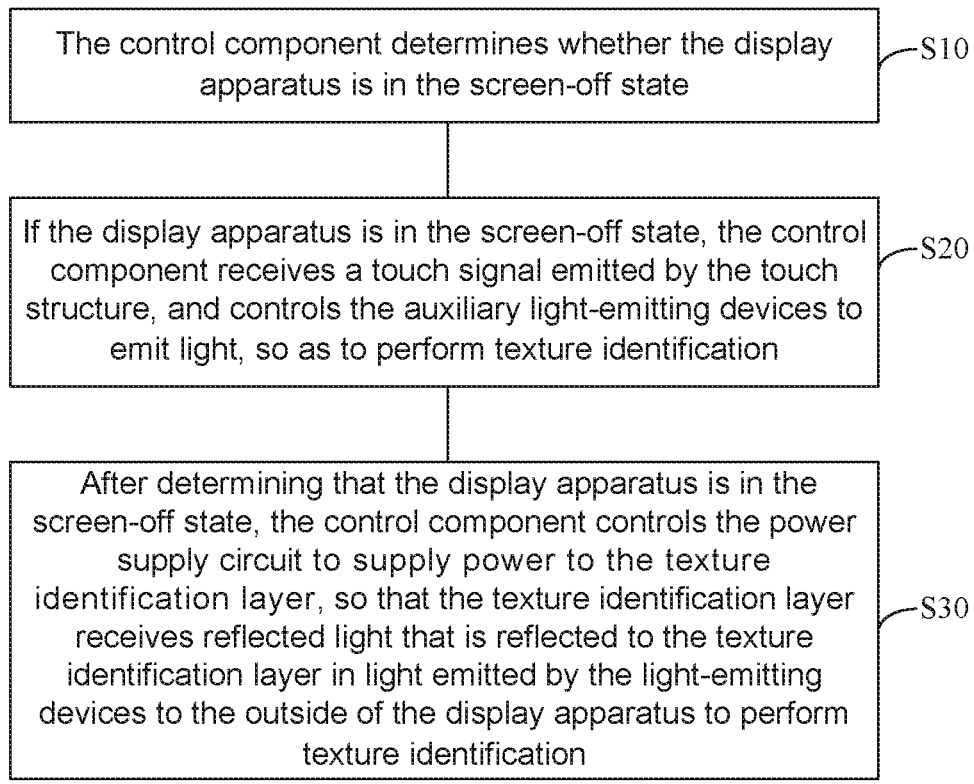
FIG. 16 is a flow diagram of another method of controlling a display apparatus, in accordance with some embodiments.

In some embodiments, as shown in FIG. 16, the method further includes the following step.

In S30, after determining that the display apparatus is in the screen-off state, the control component controls the power supply circuit to supply power to the texture identification layer, so that the texture identification layer receives reflected light that is reflected to the texture identification layer in light emitted by the light-emitting devices to the outside of the display apparatus to perform texture identification.

Figure 17:
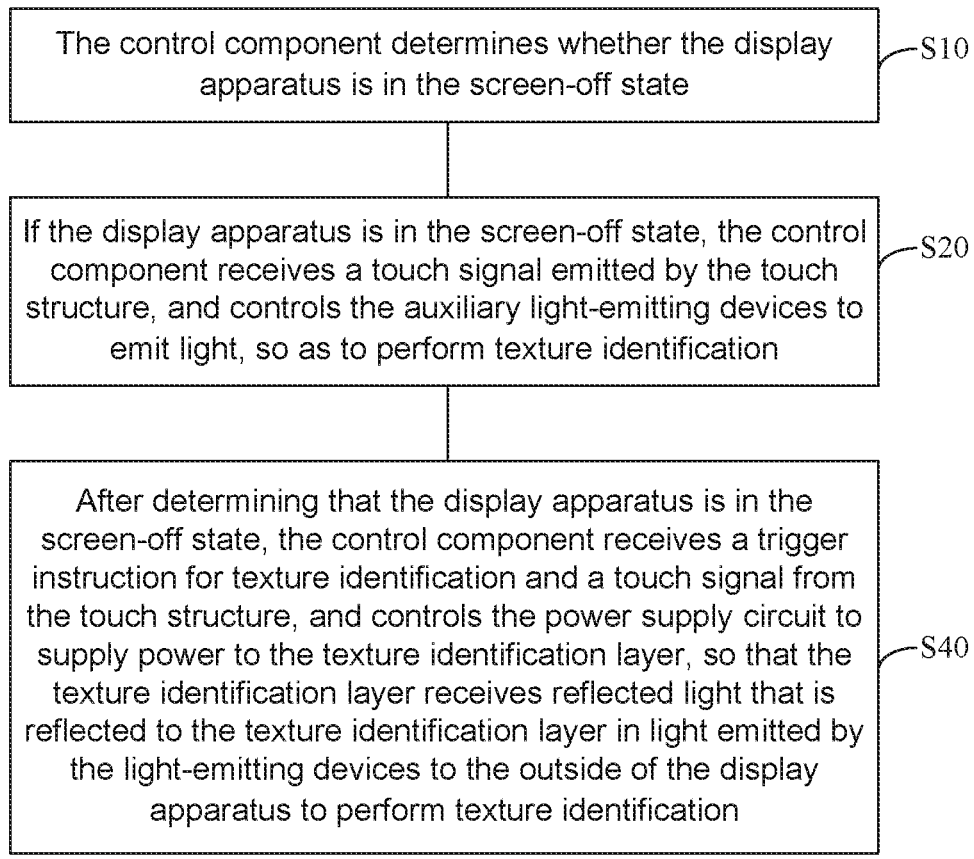
FIG. 17 is a flow diagram of yet another method of controlling a display apparatus, in accordance with some embodiments.

In some other embodiments, as shown in FIG. 17, the method further includes the following step.

In S40, after determining that the display apparatus is in the screen-off state, the control component receives a trigger instruction for texture identification and a touch signal from the touch structure, and controls the power supply circuit to supply power to the texture identification layer, so that the texture identification layer receives reflected light that is reflected to the texture identification layer in light emitted by the light-emitting devices to the outside of the display apparatus to perform texture identification.

In this case, regardless of whether the display apparatus is in the screen-on state or the screen-off state, the texture identification function may be achieved by using the control method provided by the embodiments of the present disclosure.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising:
   a base;
   light-emitting devices disposed above the base, the light-emitting devices being configured to emit light for display;
   auxiliary light-emitting devices disposed above the base, each auxiliary light-emitting device having a same light-emitting direction as the light-emitting devices and being configured to emit light in response to receiving a control signal during the display panel being in a screen-off state;
   a texture identification layer disposed above the base, the texture identification layer being configured to receive reflected light that is reflected to the texture identification layer in light emitted by the auxiliary light-emitting devices to an outside of the display panel, so as to perform texture identification;
   control circuits, each control circuit being electrically connected to a respective one of the auxiliary light-emitting devices, and being configured to control the respective one of the auxiliary light-emitting devices to emit light; and pixel circuits, each pixel circuit being electrically connected to a respective one of the light-emitting devices, and being configured to control the respective one of the light-emitting devices to emit light, wherein layers where the control circuits are located and layers where the pixel circuits are located are same layers.

2. The display panel according to claim 1, wherein one auxiliary light-emitting device of the auxiliary light-emitting devices includes a first electrode, an auxiliary light-emitting layer, and a second electrode that are sequentially stacked above the base, and the first electrode is electrically connected to a corresponding control circuit.

3. The display panel according to claim 1, wherein layers where the auxiliary light-emitting devices are located and layers where the light-emitting devices are located are same layers, each auxiliary light-emitting device is disposed between two adjacent light-emitting devices, and the auxiliary light-emitting device and any of the two adjacent light-emitting devices have a gap therebetween.

4. The display panel according to claim 3, wherein the texture identification layer includes texture identification units;

layers where the texture identification units are located and the layers where the auxiliary light-emitting devices are located are same layers; or the texture identification units are disposed at a side of the auxiliary light-emitting devices away from the base, and orthographic projections of the texture identification units on the base are non-overlapping with orthographic projections of the auxiliary light-emitting devices on the base and orthographic projections of the light-emitting devices on the base.

5. The display panel according to claim 3, wherein the texture identification layer includes texture identification units;

the texture identification units are disposed between the auxiliary light-emitting devices and the base; or the texture identification units are disposed at a side of the base away from the auxiliary light-emitting devices.

6. The display panel according to claim 5, wherein the auxiliary light-emitting devices are light-transmissive devices;

an orthographic projection of one of the auxiliary light-emitting devices on the base overlaps an orthographic projection of a corresponding texture identification unit on the base.

7. The display panel according to claim 5, wherein the auxiliary light-emitting devices are opaque devices;

the display panel further comprises light-transmitting units, layers where the light-transmitting units are located and the layers where the auxiliary light-emitting devices are located are same layers, and each light-transmitting unit is disposed between two adjacent light-emitting devices and/or between an auxiliary light-emitting device and a light-emitting device that are adjacent; and an orthographic projection of the light-transmitting unit on the base overlaps an orthographic projection of a corresponding texture identification unit on the base.

8. The display panel according to claim 4, wherein the texture identification units are disposed at the side of the auxiliary light-emitting devices away from the base, and the display panel further comprises light-shielding patterns each disposed on a surface of a respective one of the texture identification units facing the base; and an orthographic projection of one of the texture identification units on the base is located within a range of an orthographic projection of a corresponding light-shielding pattern on the base.

9. The display panel according to claim 1, wherein the auxiliary light-emitting devices are disposed at a side of the light-emitting devices proximate to the base, and an orthographic projection of one of the auxiliary light-emitting devices overlaps at least to an orthographic projection of a gap between two adjacent light-emitting devices.

10. The display panel according to claim 1, wherein the auxiliary light-emitting devices are disposed at a side of the light-emitting devices away from the base, and an orthographic projection of one of the auxiliary light-emitting devices overlaps at least to an orthographic projection of a gap between two adjacent light-emitting devices.

11. The display panel according to claim 1, wherein the display panel has a display area, and the display area includes a plurality of sub-pixel regions and a non-sub-pixel region; and each light-emitting device is located in a respective one of the plurality of sub-pixel regions, and the auxiliary light-emitting devices are located in the non-sub-pixel region.

12. The display panel according to claim 11, wherein the plurality of sub-pixel regions include a plurality of rows of sub-pixel regions arranged along a first direction, sub-pixel regions in each row are arranged in a second direction, and the first direction is intersected with the second direction; and in any two adjacent rows of sub-pixel regions, lines extending in the first direction passes through a sub-pixel region located in an even row and a region between two adjacent sub-pixel regions located in an odd row in the second direction;

two adjacent rows of sub-pixel regions have a preset gap therebetween; and a length of each auxiliary light-emitting device in the second direction and a width of the auxiliary light-emitting device in the first direction are both equal to a width of the preset gap in the first direction.

13. The display panel according to claim 1, wherein light emitted by the auxiliary light-emitting devices is invisible light.

14. A display apparatus, comprising:

the display panel according to claim 1; and a control component electrically connected to the auxiliary light-emitting devices and a touch structure, wherein the control component is configured to control the auxiliary light-emitting devices to emit light in response to receiving a touch signal from the touch structure during the display panel being in the screen-off state.

15. The display apparatus according to claim 14, further comprising a power supply circuit connected to the texture identification layer, wherein the control component is further electrically connected to the power supply circuit, and is further configured to control the power supply circuit to supply power to the texture identification layer in response to receiving a touch signal from the touch structure during the display apparatus being in a screen-off state, and control the power supply circuit to supply power to the texture identification layer in response to receiving a trigger instruction for texture identification and a touch signal from the touch structure during the display apparatus being in a screen-on state, so that the texture identification layer receives reflected light that is reflected to the texture identification layer in light emitted by the light-emitting devices to the outside of the display panel to perform texture identification.

16. The display apparatus according to claim 14, further comprising the touch structure disposed in the display panel; or,
the display apparatus further comprising a cover sheet and the touch control structure disposed on a surface of the cover sheet facing the base.

17. A method of controlling a display apparatus, wherein the apparatus comprises a display panel and a control component; the display panel includes a base and light-emitting devices, auxiliary light-emitting devices and a texture identification layer that are disposed above the base; each auxiliary light-emitting device has a same light-emitting direction as the light-emitting devices; the control component is electrically connected to the auxiliary light-emitting devices and a touch structure;
the method comprises:
determining whether the display apparatus is in a screen-off state, and
when the display apparatus is in the screen-off state;
receiving a touch signal from the touch structure; and
controlling the auxiliary light-emitting devices to emit light, by the control component, in response to receiving a touch signal from the touch structure during the display panel being in the screen-off state so that the texture identification layer receives reflected light that is reflected to the texture identification layer in light emitted by the auxiliary light-emitting devices to an outside of the display apparatus to perform texture identification.

18. The method according to claim 17, the method further comprising:
after determining that the display apparatus is in the screen-off state:
controlling a power supply circuit to supply power to the texture identification layer; or
after determining that the display apparatus is in a screen-on state:
receiving a trigger instruction for texture identification and a touch signal from the touch structure; and
controlling the power supply circuit to supply power to the texture identification layer, so as to perform texture identification.

* * * * *